US009909063B2

(12) United States Patent
Palaniswamy

(10) Patent No.: US 9,909,063 B2
(45) Date of Patent: Mar. 6, 2018

(54) POLYMER ETCHANT AND METHOD OF USING SAME

(75) Inventor: Ravi Palaniswamy, Singapore (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 565 days.

(21) Appl. No.: 13/882,068

(22) PCT Filed: Oct. 18, 2011

(86) PCT No.: PCT/US2011/056743
§ 371 (c)(1),
(2), (4) Date: Apr. 26, 2013

(87) PCT Pub. No.: WO2012/061010
PCT Pub. Date: May 10, 2012

(65) Prior Publication Data
US 2013/0207031 A1 Aug. 15, 2013

Related U.S. Application Data

(60) Provisional application No. 61/409,791, filed on Nov. 3, 2010.

(51) Int. Cl.
H01L 21/302 (2006.01)
H01L 21/461 (2006.01)
B44C 1/22 (2006.01)
C03C 15/00 (2006.01)
C03C 25/68 (2006.01)
C23F 1/00 (2006.01)
C09K 13/02 (2006.01)
H01L 21/3213 (2006.01)
H01L 21/02 (2006.01)
H01L 21/311 (2006.01)
H05K 3/00 (2006.01)
C08J 7/14 (2006.01)

(52) U.S. Cl.
CPC .......... *C09K 13/02* (2013.01); *C08J 7/14* (2013.01); *H01L 21/02118* (2013.01); *H01L 21/31133* (2013.01); *H01L 21/32134* (2013.01); *H01L 21/32139* (2013.01); *H05K 3/002* (2013.01); *H05K 2203/0793* (2013.01)

(58) Field of Classification Search
None
See application file for complete search history.

(56) References Cited

U.S. PATENT DOCUMENTS

| 3,448,098 | A | | 6/1969 | Gaines |
| 3,469,982 | A | | 9/1969 | Celeste |
| 3,526,504 | A | | 9/1970 | Celeste |
| 3,867,153 | A | | 2/1975 | MacLachlan |
| 4,340,482 | A | * | 7/1982 | Sternberg ............... 210/500.37 |
| 4,929,422 | A | | 5/1990 | Mahlkow et al. |
| 4,975,312 | A | | 12/1990 | Lusignea |
| 5,289,630 | A | | 3/1994 | Ferrier |
| 6,218,022 | B1 | | 4/2001 | Suzuki |
| 6,403,211 | B1 | | 6/2002 | Yang et al. |
| 6,896,744 | B2 | | 5/2005 | Morinaga |
| 7,323,421 | B2 | * | 1/2008 | Stinson et al. ............... 438/749 |
| 8,049,112 | B2 | | 11/2011 | Yang |
| 2002/0028293 | A1 | | 3/2002 | Yang |
| 2003/0153476 | A1 | | 8/2003 | Akita |
| 2004/0099290 | A1 | | 5/2004 | Morinaga |
| 2005/0186404 | A1 | | 8/2005 | Mao |
| 2006/0011588 | A1 | | 1/2006 | Stinson |
| 2006/0127653 | A1 | | 6/2006 | Mao |
| 2006/0237392 | A1 | * | 10/2006 | Auger et al. ............... 216/83 |
| 2007/0120089 | A1 | | 5/2007 | Mao |
| 2010/0090158 | A1 | | 4/2010 | Ishikawa |

FOREIGN PATENT DOCUMENTS

| EP | 0338641 | | 10/1989 |
| EP | 1744376 | | 1/2007 |
| FR | 2934916 | | 2/2010 |
| JP | 0415233 | | 1/1992 |
| JP | 05-202206 | * | 8/1993 |
| JP | 05202206 | | 8/1993 |
| JP | 05301981 | | 11/1993 |
| JP | 6298974 | | 10/1994 |
| JP | 6302586 | | 10/1994 |
| JP | 2001-288286 | | 10/2001 |
| JP | 2001-310959 | | 11/2001 |
| JP | 2002-082451 | | 3/2002 |
| JP | 3535602 | | 6/2004 |
| JP | 2005-085957 | | 3/2005 |
| JP | 2005-206903 | | 8/2005 |
| JP | 2006-319074 | | 11/2006 |
| JP | 2007-008969 | | 1/2007 |

(Continued)

OTHER PUBLICATIONS

"DK Thermal Solutions Offers Formable Thermal LED PCB Solutions", LED professional, Presented on Nov. 11, 2011, [retrieved from the internet on Jul. 24, 2012], URL: < http://www.led-professional.com/products/led-thermal-management/dk-thermal-solutions-offers-formable-thermal-led-pcb-solutions >, 2 pages.

"Flexible PCB with LED Assembly on heatsink", Alliance Flextech, [retrieved from the internet on Jul. 24, 2012], URL: < http://allianceflextech.com/products_detail.php?ProID=3&product=Flexible+PCB+with+LED+Assembly+on+heatsink>. 1 page.

Ascari, "A miniaturized and flexible optoelectronic sensing system for tactile skin", Journal of Micromechanices and Microengineering, 2007, vol. 17, No. 11, pp. 2288-2298.

(Continued)

Primary Examiner — Stephanie Duclair
(74) Attorney, Agent, or Firm — Clifton F. Richardson; Melanie G. Gover

(57) ABSTRACT

Provided is a composition for etching polymeric materials comprising an aqueous solution including an alkali metal salt and glycine.

11 Claims, No Drawings

(56) References Cited

FOREIGN PATENT DOCUMENTS

| | | |
|---|---|---|
| JP | 2010-251376 | 11/2010 |
| JP | 2012-064841 | 3/2012 |
| TW | 2007-09471 | 3/2007 |
| WO | WO 2007-002644 | 1/2007 |
| WO | WO 2007-089599 | 8/2007 |
| WO | 2008/039730 A1 * | 4/2008 |
| WO | WO 2012-061182 | 5/2012 |
| WO | WO 2012-061183 | 5/2012 |
| WO | WO 2012-061184 | 5/2012 |
| WO | WO 2012-112310 | 8/2012 |
| WO | WO 2012/112666 | 8/2012 |
| WO | WO 2012-112873 | 8/2012 |
| WO | WO 2013-025402 | 2/2013 |

OTHER PUBLICATIONS

Bailey, "Packaging of LED Backlights for Ruggedized Displays", International Symposium on Advanced packaging Materials: Microtech, 2010, pp. 98-101.

Huang, "Applying Surface-mounted LED's in automotive interior and exterior lighting", Proceedings of SPIE, Jan. 18, 2002, vol. 4648, pp. 148-155.

Kim, "Optimization of Flexible Substrate for COF (Chip on Flexible) LED Packaging", Electronic Components and Technology Conference, May 2009, pp. 1953-1960.

Lee, "Thermo Mechanical Properties High Performance Thermal Interface gap filter pads", Thermal and Thermo mechanical phenomena in Electronic System (ITHERM),, $12^{th}$ IEEE intersociety Conference, , Jun. 2010, 8 pages.

Nadarajah, "Flexible Inorganic Nanowire Light-Emitting Diode", 2008, Nano Letters, vol. 8, No. 2, pp. 534-537.

Huber, "Thermal Management Golden Dragon LED", OSRAM Opto Semiconductor, Apr. 2006, 11 pages.

Sagimori, "LED Array With Higher Heat Dissipation by 'Epitaxial Film Bounding' Technology", Special Edition on Component Technologies Supporting Innovative Design, Oki Technical Review, Apr. 2010, vol. 77, No. 1, Issue, 216, pp. 1-6.

Yum, "$Y_3Al_5O_{12}$:Ce0.05 phosphor coatings on a flexible substrate for use in white light-emitting diodes", Colloids and Surfaces A: Physicochem. Eng. Aspects, 2004, vol. 251, pp. 203-207.

International Search Report for PCT International Application No. PCT/US2011/056743, dated May 22, 2012, 3 pages.

* cited by examiner

POLYMER ETCHANT AND METHOD OF USING SAME

TECHNICAL FIELD

This invention relates to chemically etching polymers.

BACKGROUND

An etched copper or printed conductive circuit pattern on a polymer film base may be referred to as a flexible circuit or flexible printed wiring board. As the name suggests, flexible circuitry can move, bend and twist without damaging the conductors to permit conformity to different shapes and unique package sizes. Originally designed to replace bulky wiring harnesses, flexible circuitry is often the only solution for the miniaturization and movement needed for current, cutting-edge electronic assemblies. Thin, lightweight and ideal for complicated devices, flexible circuit design solutions range from single-sided conductive paths to complex, multilayer three-dimensional packages. Conductive paths can be created through the polymer film by creating metal-plated openings in the polymer layer. These openings can be created by various methods such as laser ablation, plasma-etching and chemical etching. However, if depressions, indentations, or the like, which do not extend all the way through the polymer film, are desired, chemical etching methods are typically preferred for creating these features. Accordingly, there continues to be a need for chemical etchants suitable for controllably etching polymer films.

SUMMARY

One aspect of the present invention provides a composition comprising an aqueous solution for etching a polymeric material comprising an alkali metal salt and glycine.

Another aspect of the present invention provides a process comprising providing a polymeric film; contacting said polymeric film with an aqueous solution comprising from about 5 wt. % to about 55 wt. % of an alkali metal salt; and from about 5 wt. % to about 30 wt. % of glycine.

An advantage of at least one embodiment of the present invention is that it allows for slow, controlled etching.

Another advantage of at least one embodiment of the present invention is that glycine is environmentally friendly and, therefore, easy to handle.

Another advantage of at least one embodiment of the present invention is that glycine does not readily evaporate, so the desired etchant concentration can be maintained for long periods without having to test and adjust the amounts of ingredients.

Another advantage of at least one embodiment of the present invention is that the etchant has a less deleterious effect on aqueous photoresist than other known etchants. This allows the photoresist to survive the etching processes without swelling and separating from the polymer film being etched.

Other features and advantages of the invention will be apparent from the following detailed description, and claims.

As used herein all amounts included as percentages refer to weight percent of a designated component.

DETAILED DESCRIPTION

As required, details of the present invention are disclosed herein; however, it is to be understood that the disclosed embodiments are merely exemplary. Therefore, specific structural and functional details disclosed herein are not to be interpreted as limiting, but merely as a basis for the claims and as a representative basis for teaching one skilled in the art to variously employ the present invention.

The present invention provides an etchant suitable for use with polymer films that are used in application such as flexible circuit substrates, microfluidic devices, and carrier films with pockets. Substrates for flexible circuits typically include a flexible polymer substrate film and copper conductive traces. (Conductive traces may also be gold, nickel or silver.) Specific flexible circuit applications include lap top computers, ink jet printers, personal digital assistants, cell phones, calculators, cameras, plasma televisions, and any device that has a display with an interface that bends or folds. Substrates for microfluidic devices that include a flexible polymer substrate film having indentations or regions of controlled depth and optionally copper conductive traces. Formation of indentations, also referred to herein as recesses, cavities, channels, trenches, wells, reservoirs, reaction chambers, and the like, creates changes of thickness in areas of the polymer films. Substrates for carrier pocket tapes for electronic components may require complex three-dimensional shapes to be etched into thick films, typically polycarbonate films.

Etchants of the present invention comprise alkali metal salts, glycine, and optionally, ethylene diamine. Water soluble salts suitable for use in the highly alkaline etchant of the present invention include, for example, potassium hydroxide (KOH), sodium hydroxide (NaOH), cesium hydroxide (CeOH), substituted ammonium hydroxides, such as tetramethylammonium hydroxide and ammonium hydroxide or mixtures thereof. Useful concentrations of the etchant solutions vary depending upon the thickness of the polymeric film to be etched, as well as the type (e.g., metal mask or photoresist) and thickness of the photoresist, if it is used. In the present invention, typical concentrations of a suitable salt have lower values of about 5 wt. % to about 30 wt % and upper values of about 45 wt % to about 55 wt. %. Typical concentrations of glycine have lower values of about 5 wt. % to about 10 wt. % and upper values of about 20 wt. % to 30 wt. %. The KOH/glycine etchant of the present invention provides slow, controlled etching which allows for precise control of the depth of etching and provides for side walls with low angle slopes, e.g., about 5° to about 60° from normal. If faster etch rates are desired, a solubilizer such as an amine compound, e.g., ethylene diamine, may be added to the etchant. Typical concentrations of an amine compound such as ethylene diamine are about 2 wt. % to about 8 wt. %, but may go beyond this range. The etching solution is generally maintained at a temperature of from about 50° C. (122° F.) to about 120° C. (248° F.) preferably from about 70° C. (160° F.) to about 95° C. (200° F.) during etching.

If used, typically the solubilizer in the etchant solution is an amine compound, such as an alkanolamine. Solubilizers for etchant solutions may be selected from the group consisting of amines, including ethylene diamine, propylene diamine, ethylamine, methylethylamine, and alkanolamines such as ethanolamine, diethanolamine, propanolamine, and the like.

The presence of glycine in the etchant provides several advantages. For example, compared to known alkali metal salts, a reduction in photoresist stripping is achieved. "Stripping" is when the photoresist swells and separates from the underlying polymeric film. The time required for etching depends upon the type and thickness of polymeric film to be etched, the composition of the etching solution, the etch temperature, spray pressure, and the desired depth of the etched region.

Polymer films of the present invention may be polycarbonates, liquid crystal polymers, polyimides, polyesters, polyamide-imide, and other suitable polymeric materials. Preferably, the film being etched is substantially fully cured.

Polyimide film is a commonly used substrate for flexible circuits that fulfill the requirements of complex, cutting-edge electronic assemblies. The film has excellent properties such as thermal stability and low dielectric constant.

Commercially available polyimide films suitable for use with the present invention include those that comprise or are made from monomers of pyromellitic dianhydride (PMDA), oxydianiline (ODA), biphenyl dianhydride (BPDA), including biphenyl tetracarboxylic dianhydride (BPDA), phenylene diamine (PDA), or p-phenylene bis(trimellitic acid monoester anhydride). Polyimide polymers including one or more of these monomers may be used to produce film products designated under the trade name KAPTON films such as H, K, and E films (available from E. I. du Pont de Nemours and Company, Circleville, Ohio); APICAL films such as AV, NP, and HPNF films (available from Kaneka Corporation, Otsu, Japan), UPILEX films such as S, SN, and VT (available from Ube Industries Pvt. Ltd, Japan, and films such as IF, IN, LN, LV, LS, GP, and GL (available from SKCKolon PI, Korea).

APICAL HPNF polyimide film is believed to be a copolymer that derives its ester unit containing structure from polymerizing of monomers including p-phenylene bis(trimellitic acid monoester anhydride). Other ester unit containing polyimide polymers are not known commercially. However, to one of ordinary skill in the art, it would be reasonable to synthesize other ester unit containing polyimide polymers depending upon selection of monomers similar to those used for APICAL HPNF. Such syntheses could expand the range of polyimide polymers for films, which, like APICAL HPNF, may be controllably etched. Materials that may be selected to increase the number of ester containing polyimide polymers include 1,3-diphenol bis(anhydro-trimellitate), 1,4-diphenol bis(anhydro-trimellitate), ethylene glycol bis(anhydro-trimellitate), biphenol bis(anhydro-trimellitate), oxy-diphenol bis(anhydro-trimellitate), bis(4-hydroxyphenyl sulfide) bis(anhydro-trimellitate), bis(4-hydroxybenzophenone) bis(anhydro-trimellitate), bis(4-hydroxyphenyl sulfone) bis(anhydro-trimellitate), bis(hydroxyphenoxybenzene), bis(anhydro-trimellitate), 1,3-diphenol bis(aminobenzoate), 1,4-diphenol bis(aminobenzoate), ethylene glycol bis(aminobenzoate), biphenol bis(aminobenzoate), oxy-diphenol bis(aminobenzoate), bis(4 aminobenzoate) bis(aminobenzoate), and the like.

LCP films represent suitable materials as substrates for many applications including microfluidic devices and flexible circuits having improved high frequency performance, lower dielectric loss, and less moisture absorption than polyimide films. Characteristics of LCP films include electrical insulation, moisture absorption less than 0.5% at saturation, a coefficient of thermal expansion approaching that of the copper used for plated through holes, and a dielectric constant not to exceed 3.5 over the functional frequency range of 1kHz to 45 GHz.

Suitable films of liquid crystal polymers comprise aromatic polyesters including copolymers containing p-phenyleneterephthalamide such as BIAC film (Japan Gore-Tex Inc., Okayama-Ken, Japan) and copolymers containing p-hydroxybenzoic acid such as LCP CT film (Kuraray Co., Ltd., Okayama, Japan).

Other suitable films include extruded and tentered (biaxially stretched) liquid crystal polymer films. A process development, described in U.S. Pat. No. 4,975,312, provided multiaxially (e.g., biaxially) oriented thermotropic polymer films of commercially available liquid crystal polymers (LCP) identified by the trade names VECTRA (naphthalene based, available from Hoechst Celanese Corp.) and XYDAR (biphenol based, available from Amoco Performance Products). Multiaxially oriented LCP films of this type represent suitable substrates for flexible printed circuits and circuit interconnects suitable for production of device assemblies such as microfluidic devices.

Characteristics of polycarbonate films include electrical insulation, moisture absorption less than 0.5% at saturation, a dielectric constant not to exceed 3.5 over the functional frequency range of 1kHz to 45 GHz, better chemical resistance when compared to polyimide, lower modulus may enable more flexible circuits, and the optical clarity of polycarbonate films will allow the formation of microfluidic devices to be used in conjunction with a variety of spectrographic techniques in the ultraviolet and visible light domains. Polycarbonates also have lower water absorption than polyimide and lower dielectric dissipation. Polycarbonates can be readily etched when a solubilizer is combined with highly alkaline aqueous etchant solutions that comprise, for example, water soluble salts of alkali metals and ammonia.

Examples of suitable polycarbonate materials include substituted and unsubstituted polycarbonates; polycarbonate blends such as polycarbonate/aliphatic polyester blends, including the blends available under the trade name XYLEX from GE Plastics, Pittsfield, Mass., polycarbonate/polyethyleneterephthalate (PC/PET) blends, polycarbonate/polybutyleneterephthalate (PC/PBT) blends, and polycarbonate/poly(ethylene 2,6-naphthalate) ((PPC/PBT, PC/PEN) blends, and any other blend of polycarbonate with a thermoplastic resin; and polycarbonate copolymers such as polycarbonate/polyethyleneterephthalate (PC/PET) and polycarbonate/polyetherimide (PC/PEI).

Another type of material suitable for use in the present invention is a polycarbonate laminate. Such a laminate may have at least two different polycarbonate layers adjacent to each other or may have at least one polycarbonate layer adjacent to a thermoplastic material layer (e.g., LEXAN GS125DL which is a polycarbonate/polyvinylidene fluoride (PVDF) laminate from GE Plastics). Polycarbonate materials may also be filled with carbon black, silica, alumina and the like or they may contain additives such as flame retardants, UV stabilizers, pigment and the like.

Embodiments of etchants of the present invention can be used with any polymeric material for which the etchant provides a desirable etch rate and desirable result. Examples of other suitable polymers include polyesters such as polyethylene terephthalate (PET), amorphous PET, polyethylene naphthalate (PEN), polybutylene terephthalate (PBT); polyamide-imides, and the like.

Embodiments of etchants of the present invention are suitable for use with manufacturing techniques used in continuous web flexible circuit processing. This allows for the production of high volume, low cost substrates. Flexible circuitry is a solution for the miniaturization and movement needed for state-of-the-art electronic assemblies. Thin, lightweight and ideal for complicated devices, flexible circuit design solutions range from single-sided conductive paths to complex, multilayer three-dimensional packages.

The formation of recessed or thinned regions, channels, reservoirs, unsupported leads, through holes and other circuit features in the film typically requires protection of portions of the polymeric film using a mask of a photocrosslinked negative acting, aqueous processable photoresist, or a metal mask. During the etching process the photoresist exhibits substantially no swelling or delamination from the polymer film.

While photoresist is commonly used as a mask for substrate etching to form polymer patterns or features, a metal also can be used. For example, a metal layer may be made by sputtering a thin layer of copper then plating additional copper to form a 1-5 µm thick layer. Photoresist is then applied to the metal layer, exposed to a pattern of radiation and developed to expose areas of the metal layer. The exposed areas of the metal layer are then etched to form a pattern. The remaining photoresist is then stripped off, leaving a metal mask. Metals other than copper may also be used as a mask. Electrolytic plating and electroless plating methods may be used to form the metal layer. Using metal masks instead of photoresist masks will typically result in increased sidewall etched angles and increased etched feature sizes.

Negative photoresists suitable for use with polymer films according to the present invention include negative acting, aqueous developable, photopolymer compositions such as those disclosed in U.S. Pat. Nos. 3,469,982; 3,448,098; 3,867,153; and 3,526,504. Such photoresists include at least a polymer matrix including crosslinkable monomers and a photoinitiator. Polymers typically used in photoresists include copolymers of methyl methacrylate, ethyl acrylate and acrylic acid, copolymers of styrene and maleic anhydride isobutyl ester and the like. Crosslinkable monomers may be multiacrylates such as trimethylol propane triacrylate.

Commercially available aqueous base, e.g., sodium carbonate developable, negative acting photoresists employed according to the present invention include polymethylmethacrylates photoresist materials such as those available under the trade name RISTON from E.I. duPont de Nemours and Co., e.g., RISTON 4720. Other useful examples include AP850 available from LeaRonal, Inc., Freeport, N.Y., and PHOTEC HU350 available from Hitachi Chemical Co. Ltd. Dry film photoresist compositions under the trade name AQUA MER are available from MacDermid, Waterbury, Conn. There are several series of AQUA MER photoresists including the "SF" and "CF" series with SF120, SF125, and CF2.0 being representative of these materials.

In an exemplary flexible circuit manufacturing process, the polymer film of a polymer-metal laminate may be chemically etched at several stages. Introduction of an etching step early in the production sequence can be used to thin the bulk film or only selected areas of the film while leaving the bulk of the film at its original thickness. Alternatively, thinning of selected areas of the film later in the flexible circuit manufacturing process can have the benefit of introducing other circuit features before altering film thickness. Regardless of when selective substrate thinning occurs in the process, film-handling characteristics remain similar to those associated with the production of conventional flexible circuits.

A similar process is the manufacture of flexible circuits comprising the step of etching, which may be used in conjunction with various known pre-etching and post-etching procedures. The sequence of such procedures may be varied as desired for the particular application. A typical additive sequence of steps may be described as follows:

Aqueous processable photoresists are laminated over both sides of a substrate comprising polymer film with a thin copper side, using standard laminating techniques. Typically, the substrate has a polymeric film layer of from about 25 µm to about 75 µm, with the copper layer being from about 1 to about 5 µm thick. The thickness of the photoresist is from about 10 µm to about 50 µm. Upon imagewise exposure of both sides of the photoresist to ultraviolet light or the like, through a mask, the exposed portions of the photoresist become insoluble by crosslinking. The resist is then developed, by removal of unexposed polymer with a dilute aqueous solution, e.g., a 0.5-1.5% sodium carbonate solution, until desired patterns are obtained on both sides of the laminate. The copper side of the laminate is then further plated to desired thickness. Chemical etching of the polymer film then proceeds by placing the laminate in a bath of etchant solution, as previously described, at a temperature of from about 50° C. to about 120° C. to etch away portions of the polymer not covered by the crosslinked resist. This exposes certain areas of the original thin copper layer. The resist is then stripped from both sides of the laminate in a 2-5% solution of an alkali metal hydroxide at from about 25° C. to about 80° C., preferably from about 25° C. to about 60° C. Subsequently, exposed portions of the original thin copper layer are etched using an etchant that does not harm the polymer film, e.g., PERMA ETCH, available from Electrochemicals, Inc.

In an alternate subtractive process, the aqueous processable photoresists are again laminated onto both sides of a substrate having a polymer film side and a copper side, using standard laminating techniques. The substrate consists of a polymeric film layer about 25 µm to about 75 µm thick with the copper layer being from about 5 µm to about 40 µm thick. The photoresist is then exposed on both sides to ultraviolet light or the like, through a suitable mask, crosslinking the exposed portions of the resist. The image is then developed with a dilute aqueous solution until desired patterns are obtained on both sides of the laminate. The copper layer is then etched to obtain circuitry, and portions of the polymeric layer thus become exposed. An additional layer of aqueous photoresist is then laminated over the first resist on the copper side and crosslinked by flood exposure to a radiation source in order to protect exposed polymeric film surface (on the copper side) from further etching. Areas of the polymeric film (on the film side) not covered by the crosslinked resist are then etched with the etchant solution at a temperature of from about 70° C. to about 120° C., and the photoresists are then stripped from both sides with a dilute basic solution, as previously described.

It is possible to introduce regions of controlled thickness into the polymer film of the flexible circuit using controlled chemical etching either before or after the etching of through holes and related voids that completely removes polymer materials as required to introduce conductive pathways through the circuit film. The step of introducing standard voids in a printed circuit typically occurs about mid-way through the circuit manufacturing process. It is convenient to complete film etching in approximately the same time frame by including one step for etching all the way through the substrate and a second etching step for etching recessed regions of controlled depth. This may be accomplished by suitable use of photoresist, crosslinked to a selected pattern by exposure to ultraviolet radiation. Upon development, removal of photoresist reveals areas of polymer film that will be etched to introduce recessed regions.

Alternatively, recessed regions may be introduced into the polymer film as an additional step after completing other features of the flexible circuit. The additional step requires lamination of photoresist to both sides of the flexible circuit followed by exposure to crosslink the photoresist according to a selected pattern. Development of the photoresist, using the dilute solution of alkali metal carbonate described previously, exposes areas of the polymer film that will be etched to controlled depths to produce indentations and associated thinned regions of film. After allowing sufficient time to etch recesses of desired depth into the polymer substrate of the flexible circuit, the protective crosslinked photoresist is stripped as before, and the resulting circuit, including selectively thinned regions, is rinsed clean.

The process steps described above may be conducted as a batch process using individual steps or in automated fashion using equipment designed to transport a web material through the process sequence from a supply roll to a wind-up roll, which collects mass produced circuits that include selectively thinned regions and indentations of controlled depth in the polymer film. Automated processing uses a web handling device that has a variety of processing stations for applying, exposing and developing photoresist coatings, as well as etching and plating the metallic parts and etching the polymer film of the starting metal to polymer laminate. Etching stations include a number of spray bars with jet nozzles that spray etchant on the moving web to etch those parts of the web not protected by crosslinked photoresist.

Similar etching processes may be used to make microfluidic devices and pocket carrier tapes for the transportation of integrated circuits and other devices used in the manufacture of, for example, printed circuit boards.

EXAMPLES

This invention is illustrated by the following examples, but the particular materials and amounts thereof recited in these examples, as well as other conditions and details should not be construed to unduly limit this invention.

Aqueous based etchants were prepared with various concentrations as shown in Table 1. The general procedure for preparing the etchants included the preparation of the various concentrations provided in Table 1 of potassium hydroxide as a stock solution by dissolving potassium hydroxide (KOH) in water ($H_2O$). Samples of about 80 ml of the various concentrations of KOH were transferred to beakers and different amounts of crystalline solid glycine, available from Sigma-Aldrich, St. Louis, Mo., U.S.A., and ethylene diamine (ED) as a neat liquid, available from Sigma-Aldrich, St. Louis, Mo., U.S.A., were added to the KOH solution to prepare different etchant solutions. The glycine was added directly and was readily soluble in the KOH solution. The ED was added directly as a neat liquid.

Some polymeric samples etched with the mixture of KOH and glycine were further treated with about 3 wt % alkaline potassium permanganate (PPM) solution The general procedure for preparing the alkaline PPM solution included dissolving 1 g of KOH in 96 g of $H_2O$ followed by the addition of 3 g of potassium permanganate ($KMnO_4$). The $KMnO_4$ readily dissolved in the KOH solution after stirring for a few minutes Samples of 0.5 mil and 1 mil thick polyimide film, available under the trade designation Upilex SN and Upilex S, respectively, from UBE Industries, Ltd., Tokyo, Japan, were used for the etching experiments. The etching was carried out from one side using aqueous photoresist, available under the trade designation KP-2150 from Kolon Industries, Inc., Gwacheon, Gyeonggi-do, Korea, as an etch mask. The various etchant compositions used for etching the polyimide films are shown in Table 1.

TABLE 1

| Etchants | KOH wt % (Stock Solution) | KOH Stock Solution (ml) | Glycine (g) | Ethylene Diamine (ml) |
|---|---|---|---|---|
| A | 49 | 80 | 16 | 0 |
| B | 49 | 80 | 18 | 0 |
| C | 49 | 80 | 20 | 0 |
| D | 51 | 80 | 16 | 0 |
| E | 51 | 80 | 18 | 0 |
| F | 51 | 80 | 20 | 0 |
| G | 47 | 80 | 18 | 0 |
| H | 49 | 80 | 18 | 0 |
| I | 52 | 80 | 18 | 0 |
| J | 49 | 80 | 16 | 2 |
| K | 49 | 80 | 16 | 3 |
| L | 49 | 80 | 16 | 4 |

Examples 1-8

Samples of 1 mil thick polyimide film, available under the trade designation Upilex S from UBE Industries, Ltd., Tokyo, Japan, were etched from one side using aqueous photoresist, available under the trade designation KP-2150 from Kolon Industries, Inc., Gwacheon, Gyeonggi-do, Korea, as an etch mask. The etching was carried out by submersing the polyimide films in KOH/glycine etchants in beakers placed in a water bath at 94° C. with constant stirring of the etchants in the beakers. After removing the photoresist from the etched samples, some of the samples were further exposed to the alkaline PPM solution described above at 50° C. for 2 minutes. The solution was kept in a thermostated water bath and the samples were submerged in the etchant solution. The etching composition, etching conditions, and the side wall etch quality for the samples are shown in Table 2.

TABLE 2

| Example | Etchant | Etching Time (sec) | Bath Temperature (° C.) | PPM Treatment | Side Wall Etch Quality |
|---|---|---|---|---|---|
| 1 | A | 480 | 94 | No | Fair |
| 2 | A | 480 | 94 | Yes | Very Good |
| 3 | G | 280 | 94 | No | Fair |
| 4 | G | 280 | 94 | Yes | Very Good |
| 5 | H | 240 | 94 | No | Fair |
| 6 | H | 240 | 94 | Yes | Very Good |
| 7 | I | 225 | 94 | No | Fair |
| 8 | I | 225 | 94 | Yes | Very Good |

Examples 9-11

Samples of 1 mil thick polyimide film, available under the trade designation Upilex S from UBE Industries, Ltd., Tokyo, Japan, were etched from one side using aqueous photoresist, available under the trade designation KP-2150 from Kolon Industries, Inc., Gwacheon, Gyeonggi-do, Korea, as an etch mask. The etching was carried out with etchant in beakers placed in a water bath at different temperatures with constant stirring of the etchant solution. After completion of the etching, the photoresist was removed and further etching was carried out with a PPM solution at 50° C. for 2 minutes by submerging the samples in the PPM which was under constant stirring. The etching temperatures and times and the etch quality of the side walls, plus an indication of how the photoresist withstood (survived) the deleterious effects of the etchant are shown in Table 3.

TABLE 3

| Example | Etchant | Bath Temperature (° C.) | Etch Time (sec) | PPM Treatment | Side Wall Etch Quality | Photoresist Survival |
|---|---|---|---|---|---|---|
| 9 | A | 94 | 660 | Yes | Good | Good |
| 10 | A | 96 | 600 | Yes | Good | Good |
| 11 | A | 98 | 480 | Yes | Good | Good |

Examples 12-29

Samples of 1 mil thick polyimide film, available under the trade designation Upilex S from UBE Industries, Ltd., Tokyo, Japan, were etched from one side using aqueous photoresist, available under the trade designation KP-2150 from Kolon Industries, Inc., Gwacheon, Gyeonggi-do, Korea, as an etch mask. The etching was carried out with etchant in beakers placed in a water bath at 94° C. with constant stirring of the etchant solution. After completion the etching, the photoresist was removed and further etching was carried out with a PPM solution at 50° C. for 2 minutes by submerging the samples in the PPM which was under constant stirring. The etching times, the etch quality of the side walls, sidewall slope (i.e., the length of the sidewall from the top surface to the bottom surface of the polyimide layer—the angle of the side wall slopes ranged from about 9° to about 13°), plus an indication of how the photoresist withstood (survived) the deleterious effects of the etchant are shown in Table 4.

TABLE 4

| Example | Etchant | Etching Time (sec) | Sidewall Etch Quality | Sidewall Slope (μm) | Photoresist Survival |
|---|---|---|---|---|---|
| 12 | A | 10 | Good | 132 | Good |
| 13 | A | 11 | Good | 135 | Good |
| 14 | A | 12 | Good | 116 | Good |
| 15 | B | 10 | Good | 171 | Good |
| 16 | B | 11 | Good | 147 | Good |
| 17 | B | 12 | Good | 142 | Good |
| 18 | C | 10 | Good | 184 | Good |
| 19 | C | 11 | Good | 190 | Good |
| 20 | C | 12 | Good | 176 | Good |
| 21 | D | 10 | Good | 146 | Good |
| 22 | D | 11 | Good | 146 | Good |
| 23 | D | 12 | Good | 156 | Good |
| 24 | E | 10 | Good | 160 | Good |
| 25 | E | 11 | Good | 134 | Good |
| 26 | E | 12 | Good | 137 | Good |
| 27 | F | 10 | Good | 162 | Good |
| 28 | F | 11 | Good | 161 | Good |
| 29 | F | 12 | Good | 151 | Good |

Examples 30-32

Samples of 0.5 mil thick polyimide film, available under the trade designation Upilex SN from UBE Industries, Ltd., Tokyo, Japan, were etched from one side using aqueous photoresist, available under the trade designation KP-2150 from Kolon Industries, Inc., Gwacheon, Gyeonggi-do, Korea, as an etch mask. The etching was carried out with etchant in beakers placed in a water bath at 94° C. with constant stirring of the etchant solution. These samples were not further treated with PPM. The etching times, the etch quality of the side, plus an indication of how the photoresist withstood (survived) the deleterious effects of the etchant for the samples are shown in Table 5. "Stripping" means that portions or pieces of the photoresist are separated from the substrate.

TABLE 5

| Example | Etchant | Etching Time (sec) | Sidewall Etch Quality | Resist Survival |
|---|---|---|---|---|
| 30 | J | 150 | Good | Partial stripping |
| 31 | K | 120 | Good | Partial stripping |
| 32 | L | 120 | Good | Partial stripping |

Various modifications and alterations of this invention will become apparent to those skilled in the art without departing from the scope and spirit of this invention and it should be understood that this invention is not to be unduly limited to the illustrative embodiments set forth herein.

What is claimed is:

1. A process comprising:
   providing a polymeric film;
   contacting said polymeric film with an aqueous solution comprising
   from about 5 wt. % to about 55 wt. % of an alkali metal salt, and
   from about 5 wt. % to about 30 wt. % of glycine; and
   etching the polymeric film to form features in the polymeric film.

2. A process according to claim 1 wherein said aqueous solution comprises from about 30 wt. % to about 45 wt. % of said alkali metal salt.

3. A process according to claim 1 wherein said aqueous solution comprises from about 10 wt. % to about 20 wt. % of said glycine.

4. A process according to claim 1 wherein said aqueous solution comprises about 42 wt. % of said alkali metal salt and about 18 wt. % of said glycine.

5. A process according to claim 1 wherein said aqueous solution comprises about 35 wt. % of said alkali metal salt and about 12 wt. % of said glycine.

6. A process according to claim 1 wherein said alkali metal salt is selected from the group consisting of sodium hydroxide, potassium hydroxide, and cesium hydroxide.

7. A process according to claim 1 wherein said aqueous solution further comprises ethylene diamine.

8. A process according to claim 1 wherein said aqueous solution comprises from about 5 wt. % to about 55 wt. % of an alkali metal salt and about 5 wt. % to about 30 wt. % glycine, and about 2 wt. % to about 8 wt. % ethylene diamine.

9. A process according to claim 1 wherein said polymeric film selected from the group consisting of polyesters, polycarbonates, polyimides, and liquid crystal polymers.

10. A process according to claim 1 wherein said polymeric film is a polyimide film comprising a monomer selected from the group consisting of aromatic dianhydride and aromatic diamine.

11. A process according to claim 1 wherein said polymeric film comprises a monomer selected from the group consisting of biphenyl tetracarboxylic dianhydride (BBDA) and phenyl diamine (PDA).

* * * * *

UNITED STATES PATENT AND TRADEMARK OFFICE
CERTIFICATE OF CORRECTION

Page 1 of 1

PATENT NO. : 9,909,063 B2
APPLICATION NO. : 13/882068
DATED : March 6, 2018
INVENTOR(S) : Ravi Palaniswamy It is certified that error appears in the above-identified patent and that said Letters Patent is hereby corrected as shown below:

In the Specification

<u>Column 3</u>
Line 64, delete "lkHz" and insert -- 1kHz --, therefor.

<u>Column 4</u>
Line 20, delete "lkHz" and insert -- 1kHz --, therefor.

Signed and Sealed this
Thirteenth Day of November, 2018

Andrei Iancu
*Director of the United States Patent and Trademark Office*